(12) United States Patent
Chen et al.

(10) Patent No.: US 7,062,697 B2
(45) Date of Patent: Jun. 13, 2006

(54) PRE-STORED DIGITAL WORD GENERATOR

(75) Inventors: Angus Chen, Hsien (TW); Ray Chen, Hsinchu (TW); Glen Chen, Hsinchu (TW)

(73) Assignee: Youngtek Electronics Corporation, Hsinchu (TW)

( * ) Notice: Subject to any disclaimer, the term of this patent is extended or adjusted under 35 U.S.C. 154(b) by 48 days.

(21) Appl. No.: 10/821,862

(22) Filed: Apr. 12, 2004

(65) Prior Publication Data

US 2005/0050411 A1    Mar. 3, 2005

Related U.S. Application Data

(63) Continuation-in-part of application No. 09/730,998, filed on Dec. 7, 2000, now abandoned.

(51) Int. Cl.
    G01R 31/28    (2006.01)
    G06F 11/00    (2006.01)
(52) U.S. Cl. .................................. 714/738; 714/728
(58) Field of Classification Search ............ 714/744, 714/728, 738
    See application file for complete search history.

(56) References Cited

U.S. PATENT DOCUMENTS

| | | | | |
|---|---|---|---|---|
| 3,772,595 A | * | 11/1973 | De Wolf et al. ............ 714/736 |
| 3,832,535 A | * | 8/1974 | De Vito ....................... 714/743 |
| 4,504,741 A | * | 3/1985 | Armitage ..................... 327/135 |
| 4,639,919 A | * | 1/1987 | Chang et al. ................ 714/743 |
| 4,733,395 A | * | 3/1988 | Gelbrich et al. ............ 714/744 |
| 4,736,375 A | * | 4/1988 | Tannhauser et al. ........ 714/743 |
| 5,265,102 A | * | 11/1993 | Saito .......................... 714/743 |
| 5,402,427 A | * | 3/1995 | Parker ........................ 714/744 |
| 5,438,259 A | * | 8/1995 | Orihashi et al. .......... 324/158.1 |
| 5,617,531 A | * | 4/1997 | Crouch et al. ................ 714/30 |
| 5,761,216 A | * | 6/1998 | Sotome et al. .............. 714/738 |
| 6,223,318 B1 | * | 4/2001 | Yamashita et al. .......... 714/744 |
| 6,477,676 B1 | * | 11/2002 | Rhodes et al. .............. 714/743 |

* cited by examiner

*Primary Examiner*—Albert DeCady
*Assistant Examiner*—Mujtaba K. Chaudry
(74) *Attorney, Agent, or Firm*—Dennison, Schultz, Dougherty & MacDonald

(57) ABSTRACT

A pre-stored digital word generator, more particularly, a digital word generator for providing multiple digital words. The pre-stored digital word generator includes a edge memory used to store a primary preset information; an edge address counter used to point to an address of the edge memory; a reloadable down counter used to count according to the primary preset information and trigger the edge address counter; and multiple word generating circuits having a secondary preset information. Therein, the word generating circuits compare the primary and secondary preset information and then produce the digital words according to a comparison result.

7 Claims, 5 Drawing Sheets

| ADDR | BIT 1-16 (MARK_COUNT) | BIT 17-20 (MARK_TAG) | BIT 21 (RISE_ENABLE) | BIT 22 (FALL_ENABLE) |
|---|---|---|---|---|
| 0 | 2 | | | |
| 1 | 2 (4-2) | 1 | 1 | 0 |
| 2 | 2 (6-4) | 2 | 1 | 0 |
| 3 | 2 (8-6) | 3 | 0 | 1 |
| 4 | 2 (10-8) | 1 | 1 | 0 |
| 5 | 2 (12-10) | 3 | 0 | 1 |
| 6 | 3 (15-12) | 5 | 0 | 1 |

FIG.5

| RISE_REGISTER OF CHANNEL1 | 1 |
|---|---|
| FALL_REGISTER OF CHANNEL1 | 3 |
| RISE_REGISTER OF CHANNEL2 | 2 |
| FALL_REGISTER OF CHANNEL2 | 4 |
| RISE_REGISTER OF CHANNEL3 | 4 |
| FALL_REGISTER OF CHANNEL3 | 5 |

FIG.6

PRE-STORED DIGITAL WORD GENERATOR

CROSS REFERENCE TO RELATED APPLICATION

This application is a continuation-in-part of U.S. application Ser. No. 09/730,998, filed on 7 Dec. 2000 now abandoned and entitled "pre-stored digital word generator".

FIELD OF THE INVENTION

The present invention is directed to a pre-stored digital word generator, and more particularly, to a digital word generator of a chip tester that employs an edge random access memory (RAM) to store the preset information of TG data so as to provide multiple digital words.

BACKGROUND OF THE INVENTION

Reference is made to FIG. 1, which is a schematic diagram of a conventional test channel inside a chip tester. In general, a conventional chip tester has multiple test channels for transmitting test vectors. For each channel, the tester needs to generate two kinds of data. One is F data and the other is TG data. F data are primary data for testing the device under test (DUT) 11 and TG data are trigger signals for triggering the signal generating circuit 10.

Reference is made to FIG. 2, which is a schematic diagram of a conventional single digital word generator for producing TG data. As shown in the figure, the conventional single digital word generator has an edge-rising counter 102, an edge-falling counter 104 and a flip-flop component 12 (i.e. a latch component). The edge-rising counter 102 is used to preset the flip-flop component 12 to output a digital "1" (i.e. making the output of the flip-flop component 12 switch to high voltage) while the edge-falling counter 104 is used to clear the flip-flop component 12 to output a digital "0" (i.e. making the output of the flip-flop component 12 switch to low voltage).

However, if the tester needs to provide TG data for multiple test channels or provide TG data with multiple pulses for a single test channel, it needs to employ a plurality of single digital word generators correspondingly. Hence, large number of word generators will be required. Since both of the edge-rising counter 102 and edge-falling counter 104 are made of multiple flip-flop components, which have large volume and are costly, it will cause the conventional tester bulky and expensive.

Accordingly, as discussed above, the prior art still has some drawbacks that could be improved. The present invention aims to resolve the drawbacks in the prior art.

SUMMARY OF THE INVENTION

An objective of the present invention is to provide a pre-stored digital word generator to produce multiple digital words.

Another objective of the present invention is to provide a pre-stored digital word generator to reduce the cost of testing a digital device.

Still another objective of the present invention is to provide a pre-stored digital word generator to make easy to program the digital word generator.

In order to achieve the objectives above, the present invention provides a pre-stored digital word generator, which includes an edge memory used to store a primary preset information; an edge address counter used to point to an address of the edge memory; a reloadable down counter used to count according to the primary preset information and trigger the edge address counter; and a plurality of word generating circuits having a secondary preset information, wherein the word generating circuits compares the primary and secondary preset information and then produce digital words for the signal generating circuits according to a comparison result.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 5 is a schematic diagram of a preferred embodiment for data arrangement of an edge RAM in accordance with the present invention.

FIG. 6 is a schematic diagram of an embodiment for data arrangement of registers in accordance with the present invention.

DETAILED DESCRIPTION

Figure 1:
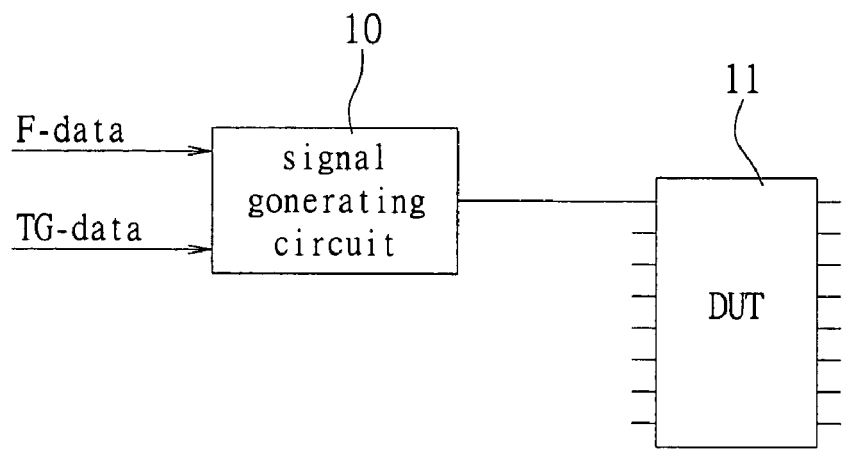
FIG. 1 is a schematic diagram of a conventional test channel inside a chip tester.
Figure 2:
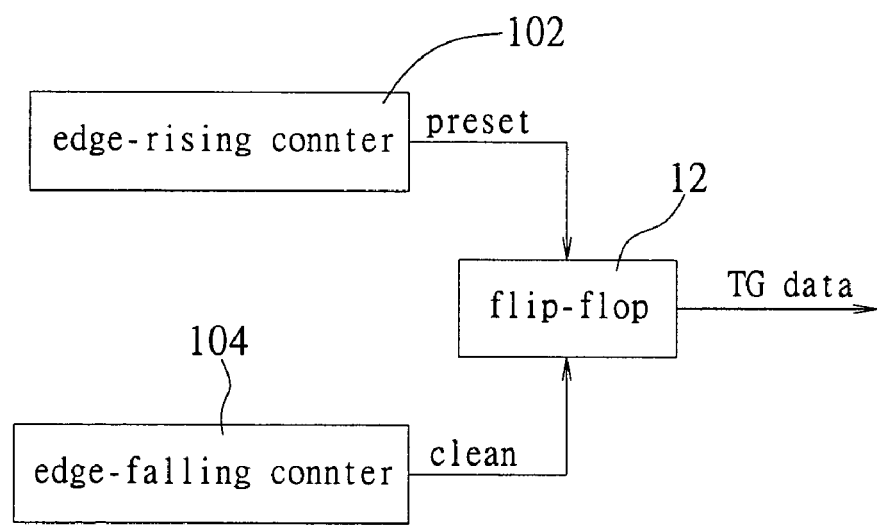
FIG. 2 is a schematic diagram of a conventional single digital word generator for producing TG data.
Figure 3:
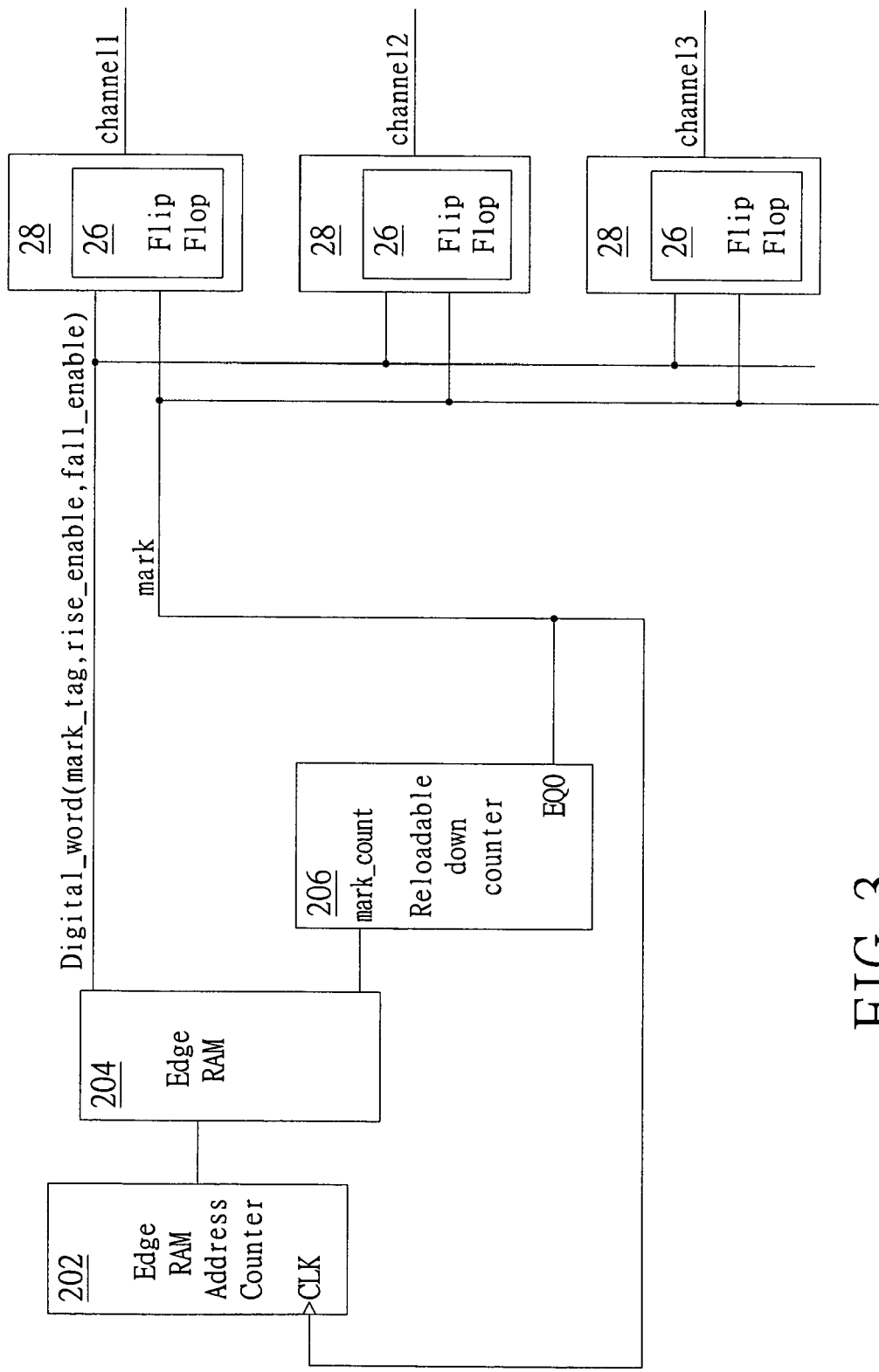
FIG. 3 is a block diagram of a pre-stored digital word generator in accordance with the present invention.
Figure 4:
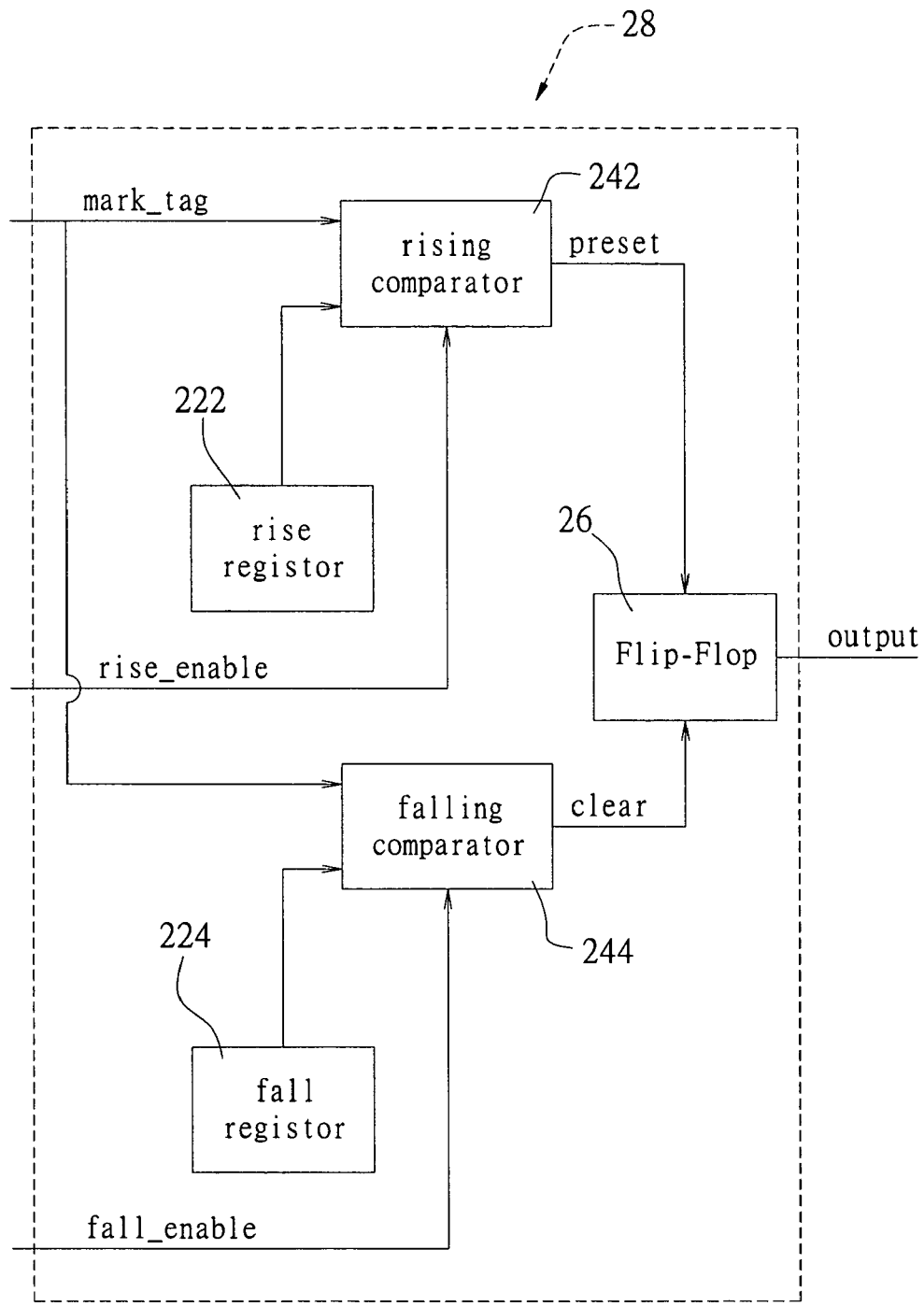
FIG. 4 is a block diagram of a word generating circuit in accordance with the present invention.

Reference is made to FIG. 3, which is a block diagram of a pre-stored digital word generator in accordance with the present invention. It includes an edge random access memory (RAM) address counter 202, an edge RAM 204, a reloadable down counter 206 and multiple word generating circuits 28. Therein, as shown in FIG. 4, the word generating circuits 28 each has a rise register 222, a fall register 224, a rising comparator 242, a falling comparator 244 and a flip-flop component 26.

The edge RAM 204 is used to store the preset information of TG data. An example of the preset information is shown in FIG. 5. The present information for each address includes mark_count, mark_tag, rise_enable and fall_enable. In practice, a user can reset the edge RAM 204 easily. Hence, the present invention can make the digital word generator easy to program.

The edge RAM address counter 202 is used to count the memory address of the edge RAM 204. Every time when it is triggered by the reloadable down counter 206, it will point to the next address of the edge RAM 204.

Furthermore, every time when the reloadable down counter 206 counts down to zero, it will output a mark signal to trigger the edge RAM address counter 202 and word generating circuits 28. In addition, when the reloadable down counter 206 receives the mark_count information, it will be re-loaded by the mark_count information and then count accordingly. After finishing its counting, it will send out a mark signal again.

Each of the word generating circuits 28 is used to produce a digital word according to the information received from the edge RAM 204. When it is triggered, it will use the rising comparator 242 and falling comparator 244 to compare the received information with the information stored in the registers 222 and 224 to determine whether the flip-flop component 26 should be preset or cleared so as to produce the digital word.

The information stored in the registers 222 and 224 are set by the tester when the tester needs to send out TG data. An example of the information stored in the registers of the word generating circuits 28 is shown in FIG. 6.

Figure 7:
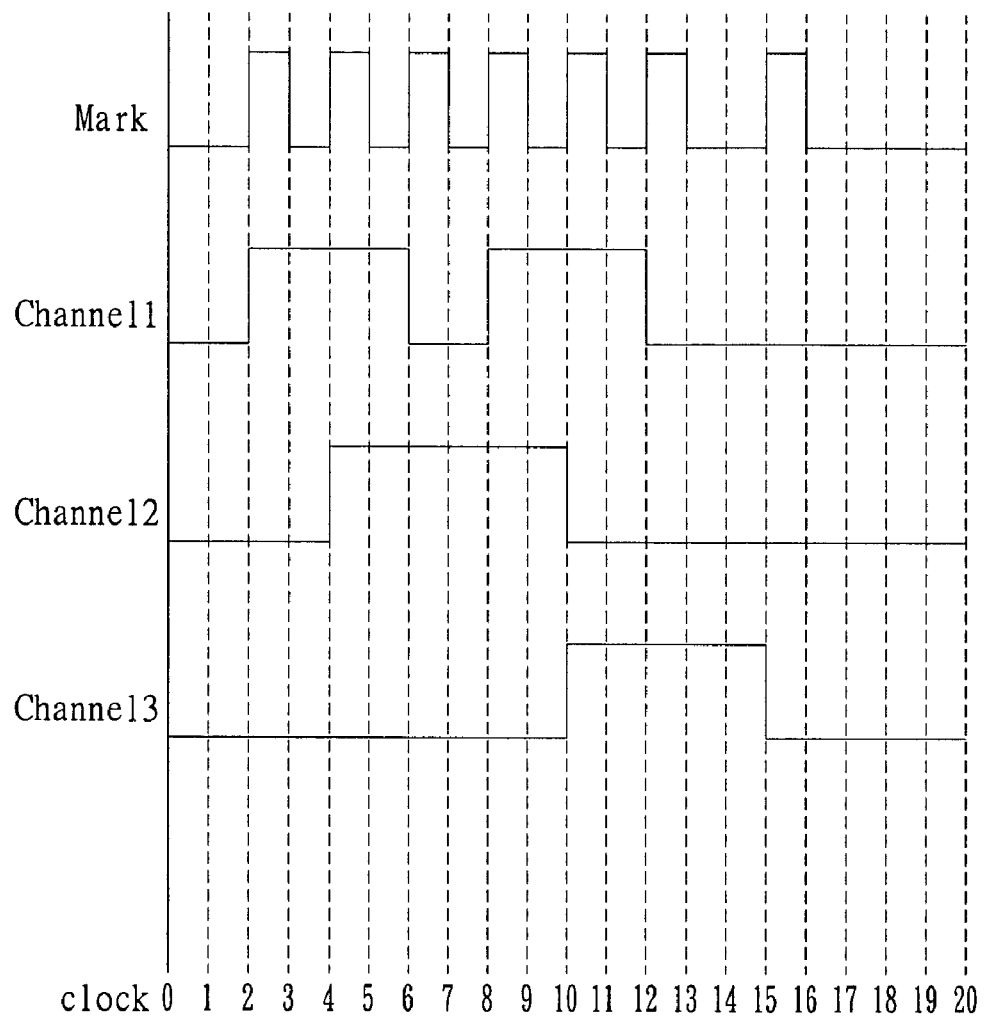
FIG. 7 is a waveform diagram of outputs of the pre-stored digital word generator in accordance with the present invention.

In order to make the present invention clearer, reference is made to FIGS. 5–6 together with FIG. 7, which is a waveform diagram of the output of the pre-stored digital word generator in accordance with the present invention. Initially, the edge RAM address counter 202 will point to address #0 of the edge RAM 204. Then, the corresponding information will be sent to the reloadable down counter 206 and the word generating circuits 28. The corresponding mark_tag, rise_enable and fall_enable information, i.e. "1", "1" and "0", will be sent to the word generating circuits 28 and the mark_count information, i.e. "2", will be sent to the reloadable down counter 206.

When received the mark_count information, i.e. "2" as shown in FIG. 5, the reloadable down counter 206 will be re-loaded and then count backwards from two to zero. After finishing the counting, the reloadable down counter 206 will send out the first mark signal to make the edge RAM address counter 202 point to address #1 and trigger the word generating circuits 28.

At this moment, the word generating circuits 28 will use the rising comparator 242 and falling comparator 244 to compare the mark_tag information, i.e. "1" as shown in FIG. 5, received from the edge RAM 204 with the information stored in the registers 222 and 224 as shown in FIG. 6. Take channel 1 for example. Since the information stored in the rise register 222 of channel 1 is "1", which is the same as the mark_tag value stored in address #0 of the edge RAM 204, and the rising comparator 242 of channel 1 is enabled by the rise_enable signal, i.e. "1" as shown in FIG. 5, the rising comparator 242 of channel 1 will make the flip-flop component 26 switch to high voltage. Hence, at clock #2 shown in FIG. 7, channel 1 starts to send a digital "1", i.e. a high-voltage signal.

Next, when the edge RAM address counter 202 counts to address #2, it will make the reloadable down counter 206 send out the third mark signal. At this moment, since the information stored in the fall register 224 of channel 1 is 3, which is the same as the mark_tag value stored in address #2 of the edge RAM 204, and the falling comparator 244 of channel 1 is enabled by the fall_enable signal, the falling comparator 244 of channel 1 will make the flip-flop component 26 switch to low voltage. Hence, at clock #6, channel 1 is changed to send a digital "0", i.e. a low-voltage signal. Since other operations of the word generating circuits 28 are the same as mentioned above, they won't be described in detail.

Summing up, the present invention has following features:
(1) The present invention can produce multiple digital words.
(2) Since the present invention uses fewer counters and hence has less flip-flop components, it can reduce the cost for testing a digital device.
(3) Since edge RAM can be reset arbitrarily, the present invention can be easily programmed.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A pre-stored digital word generator for producing multiple digital words, wherein the pre-stored digital word generator is applied to trigger a signal generating circuits of a plurality of test channels of a chip tester, the pre-stored digital word generator comprising:
    an edge memory used to store a primary preset information;
    an edge address counter electrically connected with the edge memory and used to point to an address of the edge memory;
    a reloadable down counter electrically connected with the edge memory for accessing the primary preset information of the address that is pointed by the edge address counter, wherein the reloadable down counter counts according to the primary preset information; and
    a plurality of word generating circuits electrically connected with the edge memory and the reloadable down counter, further comprising a rise register used to store a first register data of the secondary preset information; a fall register used to store a second register data of the secondary preset information; a rising comparator used to compare the mark_tag data of the primary preset information, which is pointed by the edge address counter, with the first register data to form a rising comparison result; a falling comparator used to compare the mark_tag data of the primary preset information, which is pointed by the edge address counter, with the second register data to form a falling comparison result; and a latch component used to produce the trigger signals according to the rising comparison result and the falling comparison result;
    wherein the word generating circuits having a secondary preset information, wherein the word generating circuits compares the primary and secondary preset information and then produce digital words for triggering the signal generating circuits according to a comparison result, and every time when the reloadable down counter finishes its counting, the reloadable down counter triggers the edge address counter to make the edge address counter point to a next address of the edge memory and trigger the word generating circuits to make the word generating circuits output the digital words.

2. The pre-stored digital word generator as claimed in claim 1, wherein the primary preset information comprises a mark_count data, a mark_tag data, a rise_eable data and a fall_enable data.

3. The pre-stored digital word generator as claimed in claim 1, wherein the reloadable down counter counts according to the mark_count data of the primary preset information.

4. The pre-stored digital word generator as claimed in claim 1, wherein the rising comparator is enabled according to the rise_eable data.

5. The pre-stored digital word generator as claimed in claim 1, wherein the falling comparator is enabled according to the fall_enable data.

6. The pre-stored digital word generator as claimed in claim 1, wherein the latch component is a flip-flop component.

7. A pre-stored digital word generator for producing multiple digital words, wherein the pre-stored digital word generator is applied to trigger a signal generating circuits of a plurality of test channels of a chip tester, the pre-stored digital word generator comprising:

an edge memory used to store a primary preset information;

an edge address counter electrically connected with the edge memory and used to point to an address of the edge memory:

a reloadable down counter electrically connected with the edge memory for accessing the primary preset information of the address that is pointed by the edge address counter, wherein the reloadable down counter counts according to the primary preset information; and a plurality of word generating circuits electrically connected with the edge memory and the reloadable down counter, further comprising a rise register used to store a first register data of the secondary preset information; a fall register used to store a second register data of the secondary preset information; a rising comparator used to compare the mark tag data of the primary preset information, which is pointed by the edge address counter, with the first register data to form a rising comparison result; a falling comparator used to compare the mark_tag data of the primary preset information, which is pointed by the edge address counter, with the second register data to form a falling comparison result; and a latch component used to produce the trigger signals according to the rising comparison result and the falling comparison result;

wherein the word generating circuits having a secondary preset information, wherein the word generating circuits compares the primary and secondary preset information and then produce digital words for triggering the signal generating circuits according to a comparison result, and every time when the reloadable down counter finishes its counting, the reloadable down counter triggers the edge address counter to make the edge address counter point to a next address of the edge memory and trigger the word generating circuits to make the word generating circuits output the digital words; and wherein the latch is switched to a high voltage when the mark_tag data of the primary preset information matches with the first register data; the latch is switched to a low voltage when the mark_tag data of the primary preset information matches with the second register data.

* * * * *